United States Patent
Ebihara et al.

(10) Patent No.: US 6,794,026 B2
(45) Date of Patent: Sep. 21, 2004

(54) RADIATING SHEET AND PDP PANEL

(75) Inventors: Fumitaka Ebihara, Kawaguchi (JP);
Masao Tatsuzawa, Oura-Gun (JP);
Masahiko Takahashi, Oura-Gun (JP)

(73) Assignee: Mochida Corporation, Tokyo (JP)

( * ) Notice: Subject to any disclaimer, the term of this patent is extended or adjusted under 35 U.S.C. 154(b) by 105 days.

(21) Appl. No.: 10/194,701

(22) Filed: Jul. 12, 2002

(65) Prior Publication Data

US 2003/0017320 A1 Jan. 23, 2003

(30) Foreign Application Priority Data

Jul. 13, 2001 (JP) ........................................ 2001-213416

(51) Int. Cl.$^7$ ................................................. B32B 3/26
(52) U.S. Cl. .............................. 428/319.1; 428/317.1; 428/317.7; 428/317.9; 428/447; 428/423.1; 428/425.5; 428/425.6; 428/425.8; 361/704; 361/709
(58) Field of Search ........................... 428/317.9, 317.1, 428/317.7, 319.1, 447, 423.1, 425.5, 425.6, 425.8

(56) References Cited

U.S. PATENT DOCUMENTS

| | | | | |
|---|---|---|---|---|
| 4,690,831 A | * | 9/1987 | Uken et al. ................. | 427/505 |
| 5,147,510 A | * | 9/1992 | Iura et al. ................. | 174/117 F |
| 5,279,890 A | * | 1/1994 | Ikeno et al. ................ | 428/217 |
| 5,588,856 A | * | 12/1996 | Collins et al. .............. | 439/204 |
| 6,228,449 B1 | * | 5/2001 | Meyer ....................... | 428/40.1 |

* cited by examiner

*Primary Examiner*—Terrel Morris
*Assistant Examiner*—Hai Vo
(74) *Attorney, Agent, or Firm*—Ladas & Parry LLP

(57) ABSTRACT

To realize uniform heat distribution by adhering a radiating sheet tightly to a radiating element such as a PDP glass panel, and a heat sink such as an aluminum chassis, transfer heat smoothly to the heat sink such as the aluminum, and release foams entrapped between the radiating sheet and radiating element or heat sink efficiently. The radiating sheet is composed by impregnating a radiating material selected from the group consisting of a radiating gel and a radiating grease in a radiating base material having continuous foams, and layers excellent in heat releasing properties such as a silicone gel or an luminum foil may be formed further on the radiating sheet, or cuts may be made into these layers.

5 Claims, 2 Drawing Sheets

RADIATING SHEET AND PDP PANEL

BACKGROUND OF THE INVENTION

1. Field of the Invention

The present invention relates to a radiating film or radiating sheet containing a polymer material, and more particularly to a radiating sheet for releasing heat efficiently by inserting to fill in a gap between a heat generating element of electric appliance such as power transistor, hi-density integrated circuit, plasma display panel (or PDP glass panel in some cases), and a heat sink such as an aluminum chassis (or aluminum panel in some cases). The invention also relates to a PDP panel formed by inserting a radiating sheet between a glass panel and an aluminum panel.

2. Description of the Related Art

Recently, as electronic appliances are enhanced in performance and reduced in size, the trend of higher density and higher function of semiconductors and other electronic components is progressing. As the electronic components are becoming higher in density and function, a larger amount of heat is generated from the electronic components themselves. If this heat is left over, the quality of the electronic components deteriorates, or the electronic components may be damaged, and therefore the device or mechanism for efficiently removing the heat generated by electronic components is indispensable. For example, if a heat generating element is a PDP glass panel, when the PDP panel is illuminated, heat is generated and uneven temperature occurs partly, which may lead to breakage of glass.

At the present time, as a method of removing heat generated from heat generating elements in an electronic appliance, it is known to insert a radiating material between a heat generating source (or heat generating element in some cases) of the electronic appliance and an aluminum radiating fin. The radiating material used herein includes silicone radiating grease, silicone radiating sheet, acrylic radiating pressure-sensitive adhesive sheet, urethane radiating pressure-sensitive adhesive sheet, and others. These radiating materials are prepared by blending flexible polymer materials and fillers of high heat conductivity. Such radiating materials are known to have also a shock absorbing effect besides the heat releasing effect.

In the radiating material using such conventional silicone radiating grease or silicone radiating sheet, the heat releasing performance is excellent because it can be filled with a large amount of radiating filler large in heat conductivity, but there is no function as pressure-sensitive adhesive, and it must be fixed between the aluminum chassis and heat generating source by screwing or other means, and in the manufacturing process of electronic appliances, it was hard to fix if desired to fix the silicone radiating sheet to heat generating source of the CPU and the like or aluminum chassis and the like.

On the other hand, the acrylic radiating pressure-sensitive sheet and urethane radiating pressure-sensitive adhesive sheet are excellent in fixing performance as compared with the silicone radiating grease or silicone radiating sheet, but the heat conductivity is extremely low as compared with that of silicone radiating material, and heat could not be transmitted sufficiently to the aluminum chassis.

Or, for fixing the PDP glass panel and aluminum heat sink, a double-sided acrylic adhesive tape may be adhered to the end portions and a silicone radiating sheet may be used in the center, but in this case the adhering effect and radiating effect were low.

In the light of the problems of such radiating sheets, it was also proposed to use a radiating sheet having a performance of pressure-sensitive adhesive, capable of being fixed between the heat generating source and heat sink such as aluminum chassis, and also excellent in radiating performance. In this sheet, a pressure-sensitive adhesive layer was adhered to the surface of the silicone radiating sheet or part of the surface, and acrylic adhesive or urethane adhesive was mostly used in the pressure-sensitive adhesive layer.

However, in the case of a radiating sheet for a PDP, for example, the radiating sheet is inserted between the PDP glass panel and aluminum chassis, but the aluminum chassis used herein is not a mere flat plate, but is a structure having an irregular shape for mounting IC parts, or having holes and the like for passing wires, and is formed by die casting or pressing of aluminum plate.

Since the aluminum is distorted in this forming process, if the radiating sheet is compressed and fitted tightly between the aluminum chassis and PDP glass panel, in the conventional radiating material, an air layer is formed between the PDP panel glass and radiating sheet, or between the aluminum chassis and the radiating sheet, and a partial temperature unevenness occurs in the PDP glass panel, and the glass maybe broken. Such uneven distribution of heat is a major cause of breakage of PDP glass.

This problem is not limited to the heat generating element of the PDP glass panel, but it also causes to lower the contact rate with the radiating sheet, heat generating element and heat sink.

Accordingly, there has been a keen desire for a radiating sheet which contacts tightly with a heat generating element such as the PDP glass panel and the heat sink such as aluminum chassis, and is uniform in heat distribution and is excellent in heat transfer to the heat sink of aluminum or the like.

SUMMARY OF THE INVENTION

The invention is achieved in the background described above, and it is hence an object of the invention to provide a radiating sheet capable of preventing defective contact due to poor precision of aluminum panel, and releasing heat efficiently and uniformly from the heat generating element such as the PDP glass panel. It is another object to present a radiating sheet contacting tightly with a heat generating element and a glass panel. It is a further object of the invention to present a PDP panel formed by inserting such radiating sheet between a glass panel and an aluminum panel.

The invention relates to a radiating sheet for contacting tightly with a heat generating element such as a PDP glass panel and a heat sink such as aluminum chassis, and distributing the heat uniformly, and the object of the invention is achieved by a radiating sheet characterized by forming a spongiform radiating element by impregnating any one of radiating materials selected from the group consisting of a radiating gel and a radiating grease, in a radiating base material having continuous foams.

Preferably, the radiating base material may be a urethane foamed material, or the radiating gel may be composed of a silicone gel and a filler. The radiating grease may be a silicone radiating grease.

In another aspect, a spongiform radiating element/radiating material layer may be formed by coating whole or part of a surface of a spongiform radiating element with a silicone radiating sheet, or a spongiform radiating element/aluminum foil layer may be formed by adhering an aluminum foil layer to a spongiform radiating element.

Preferably, an acrylic pressure-sensitive adhesive may be applied to the surface of thus obtained radiating sheet of a spongiform radiating element, or layered radiating sheet forming a spongiform radiating element/radiating material layer or a spongiform radiating element/aluminum foil layer.

Preferably, a cut may be formed in the surface of the spongiform radiating sheet, layered radiating sheet, or radiating sheet on which an acrylic pressure-sensitive adhesive is applied.

By forming such radiating sheet between a glass panel and an aluminum panel, the PDP panel as the object of the invention is obtained (in the invention, the PDP panel refers to one having a radiating sheet inserted between a PDP glass panel and a heat sink such as aluminum panel).

DESCRIPTION OF THE PREFERRED EMBODIMENTS

Figure 1:
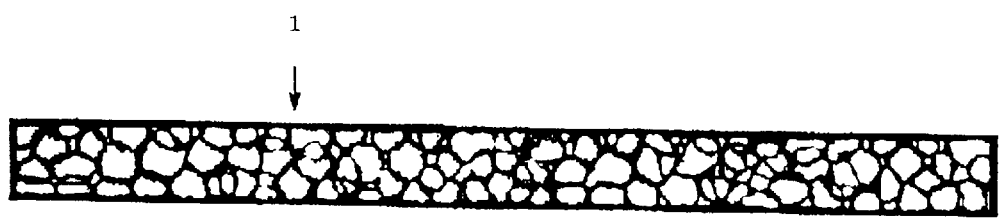
FIG. 1 is a schematic sectional view of a radiating base material.

Referring now to the drawings, preferred embodiments of the invention are described below.

FIG. 1 is a schematic sectional external view of a radiating base material 1, and this radiating base material 1 is preferably a foamed urethane (also called urethane foam or urethane foamed element in some cases herein).

Figure 2:
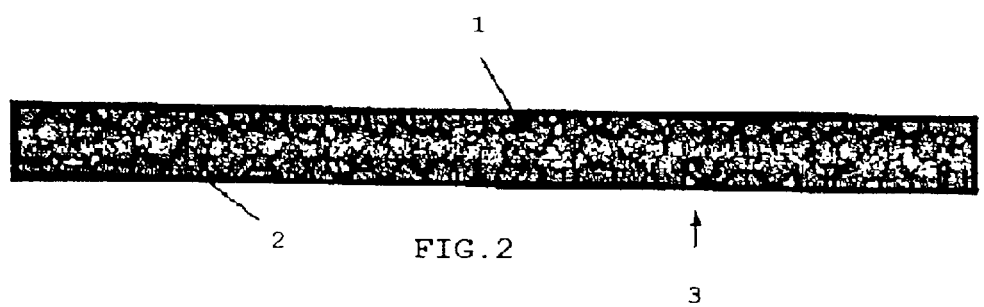
FIG. 2 is a schematic sectional view showing a configuration of a radiating sheet composed by impregnating a radiating material in a radiating base material having continuous foams.

FIG. 2 is a schematic sectional view showing a configuration of a radiating sheet of the invention, that is, a spongiform radiating element 3. The spongiform radiating element 3 of the invention is composed by impregnating a radiating material 2 in the radiating base material 1 having continuous foams, and the radiating material 2 is radiating gel or radiating grease, and preferably the radiating gel is composed of a silicone gel and a filler, and the filler is powder of high heat conductivity made from alumina, zinc oxide, aluminum hydroxide, silicon carbide, magnesia, boron nitride, etc., and the filler is preferably blended by 200 parts or more by weight to 100 parts by weight of silicone. The radiating grease is preferably a silicone radiating grease.

The foamed urethane has a porosity of about 95%. In this foamed urethane, a radiating material such as radiating gel or radiating grease is impregnated, and the porosity is controlled in a range of 10% to 80%, preferably 30% to 60%, and more preferably 40%.

After immersing the radiating material 2 in the radiating base material 1, by passing through rolls, the porosity is adjusted, and by heating, the radiating material 2 is cured.

Thus, since the spongiform radiating element 3 impregnated with the radiating material 2 such as radiating gel or radiating grease has pores, and if the precision of the aluminum panel is not high, contact failure due to entrapment of foams does not take place.

Further, as the radiating sheet is pressurized, pores are decreased and the contact tightness is enhanced. Since the impregnated radiating material is uniformly contacting with the PDP glass panel and aluminum panel, a sufficient radiating effect can be obtained.

Although not shown, by forming a cut in the surface of the radiating sheet, the effect of releasing the foams is enhanced.

By forming a layer of silicone radiating gel or aluminum foil excellent in heat conductivity on the radiating sheet, the heat is distributed uniformly on a flat plane on which the layer is formed.

White strips shown in upper and lower central area in the drawings schematically show pores of the spongiform radiating element 3, but actually the pores are not formed like strips but are substantially disposed uniformly in the entire texture of the spongiform radiating element 3, and other drawings also show similarly. The drawings are sectional views, and the pores appear to be discontinuous, but actually they are continuous, and other drawings also show similarly.

Figure 3:
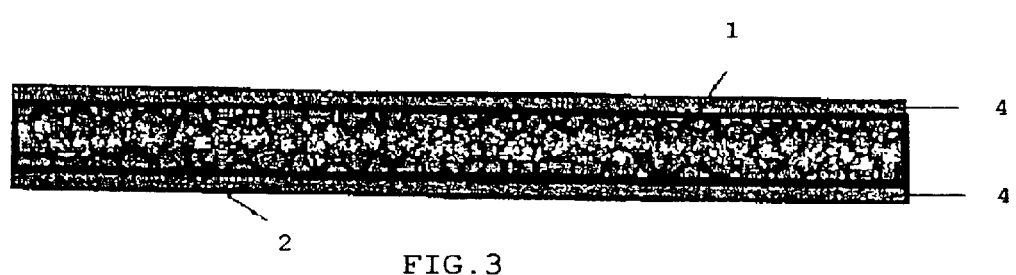
FIG. 3 is a schematic sectional view showing an embodiment of the invention forming a radiating silicone gel layer by coating both sides of the radiating sheet shown in FIG. 2 with a radiating silicone gel.

FIG. 3 is a schematic sectional view showing an embodiment of a radiating sheet in the invention forming a radiating silicone gel layer 4 on both sides of the radiating sheet (spongiform radiating element 3) shown in FIG. 2, that is, the both sides of the spongiform radiating element 3 in FIG. 2 are coated with the radiating material 2.

By heating the radiating material 2 after coating the surface of the radiating sheet (spongiform radiating element 3) in FIG. 2, the radiating material 2 is cured, and a spongiform heating element/radiating material layer is formed.

The radiating silicone gel layer 4 may be also formed on both sides of the spongiform radiating element 3, or on one side only. Further, it may be formed on the entire surface or in part.

When the radiating silicone gel layer 4 is formed on the entire surface of the aluminum panel side of defective precision, foams may be entrapped, but lowering of contact rate can be suppressed by sufficient deformation of the foamed urethane layer (spongiform radiating element 3) impregnated with radiating silicone having multiple pores in the pressurizing process, and ventilation of the radiating silicone gel layer 4.

When a cut is made in the surface, pores captured in the interface can be efficiently released through the foamed layer.

Although not shown in the drawings, a film may contact tightly with the spongiform radiating element/radiating material layer, and in such a case, by coating the film with the radiating material, a film/uncured radiating material layer is formed, and the radiating material is immersed in the radiating base material and passes through rolls, and an uncured spongiform radiating element is formed, and the film/uncured radiating material layer and the uncured spongiform radiating element are fitted tightly together so that the film may come to the surface, and by heating and curing, the radiating sheet tightly fitted with the film is formed. Thus, since the film is fitted tightly, the film and radiating material do not adhere to each other, so that the film can be peeled off easily. Meanwhile, either the film/uncured radiating material layer or the uncured spongiform radiating element may be heated and cured.

The radiating sheet tightly fitted with the film can be used by peeling off the film, and at this time the smoothness of the radiating material layer surface peeled off from the film is improved.

Figure 4:
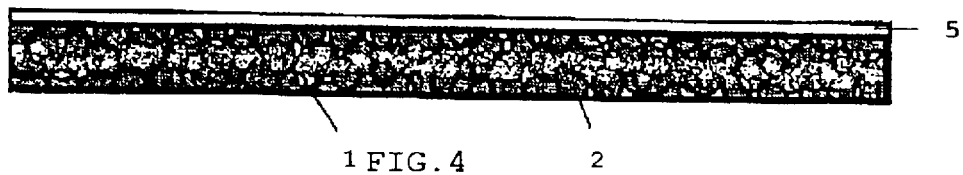
FIG. 4 is a schematic sectional view showing another embodiment of the invention having an aluminum foil formed on one side of the radiating sheet shown in FIG. 2.

FIG. 4 is a schematic sectional view showing another embodiment of a radiating sheet in the invention having an aluminum foil formed on one side of the spongiform radiating element in FIG. 2. An aluminum foil layer 5 is disposed at the PDP glass panel side, and heat is distributed uniformly on the flat plane on which the layer is formed same as in the case of FIG. 3. The aluminum foil layer 5 may be formed on the entire surface, or in part.

The radiating sheet in FIG. 4 can be manufactured in a method comprising a step of applying a primer for adhering a radiating material on an aluminum foil, and applying the radiating material thereon and heating and curing to form an aluminum foil/radiating material layer, a step of immersing the radiating material in a radiating base material, and passing through rolls to form an uncured spongiform radiating element, and a step of heating and curing by fitting the aluminum foil/radiating material layer and the uncured spongiform radiating element tightly so that the aluminum foil layer 5 may come to the surface side.

For example, in the case of the radiating material 2 made of radiating silicone gel and the radiating base material 1 made of foamed urethane, first, a primer for adhering the radiating silicone gel is applied on an aluminum foil, the radiating silicone gel is applied thereon, and heated and cured to form an aluminum foil/radiating silicone layer. On the other hand, the radiating silicone gel is immersed in the foamed urethane, and passed through rolls. The urethane impregnating the radiating silicone gel and the aluminum foil/radiating silicone layer are fitted tightly so that the aluminum foil layer 5 may come to the surface side, and heated and cured to manufacture.

It is also possible to manufacture in another method comprising a step of applying a primer for adhering a radiating material on an aluminum foil, and applying the radiating material thereon to form an aluminum foil/uncured radiating material layer, a step of immersing the radiating material in a radiating base material, and passing through rolls to form an uncured spongiform radiating element, and a step of heating and curing by fitting the aluminum foil/uncured radiating material layer and the uncured spongiform radiating element tightly so that the aluminum foil layer 5 may come to the surface side.

Further, it is manufactured in a method comprising a step of applying a primer for adhering a radiating material on an aluminum foil to form a primer coated aluminum foil, a step of immersing the radiating material in a radiating base material, and passing through rolls to form an uncured spongiform radiating element, and a step of heating and curing by fitting the primer coated aluminum foil and the uncured spongiform radiating element tightly so that the aluminum foil layer 5 may come to the surface side.

As described above, the aluminum foil may be coated with the radiating material, or may not be coated, but when coated with the radiating material, the heat conductivity and adhesion are improved. When the aluminum foil is coated with the radiating material, at least one of the radiating material at the aluminum foil side (aluminum foil/radiating material side) and the radiating material impregnated with the spongiform radiating element may be uncured and may be cured after being tightly fitted, or both may be uncured and may be cured after tight contacting.

Figure 5:
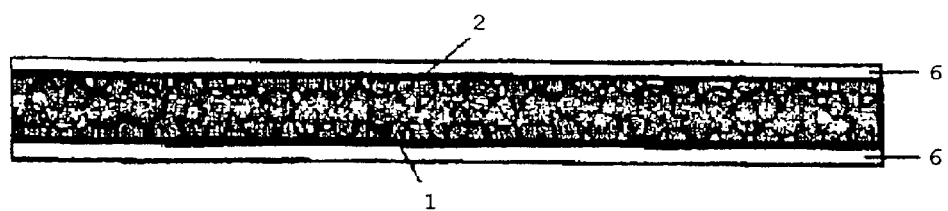
FIG. 5 is a schematic sectional view showing a different embodiment of the invention having an acrylic adhesive applied on both sides of the radiating sheet shown in FIG. 2.

FIG. 5 is a schematic sectional view showing a different embodiment of a radiating sheet in the invention having an acrylic pressure-sensitive adhesive 6 applied on both sides of the spongiform radiating element 3 shown in FIG. 2.

The acrylic pressure-sensitive adhesive 6 adheres and fixes the PDP glass panel, aluminum heat sink, and radiating sheet. The acrylic pressure-sensitive adhesive 6 is applied in the whole or part of the radiating sheet. After forming an aluminum foil layer 5 or radiating silicone gel layer 4 on the spongiform radiating element 3, the acrylic pressure-sensitive adhesive 6 may be applied on the surface.

The radiating sheet in FIG. 5 is manufactured in a method comprising a step of coating a film having a peelable acrylic pressure-sensitive adhesive, and applying a primer for adhering with a radiating material to form a primer coated acrylic pressure-sensitive adhesive, a step of immersing a radiating material in a radiating base material, and passing through rolls to form an uncured spongiform radiating element, and a step of heating and curing by fitting tightly the uncured spongiform radiating element and the primer coated acrylic pressure-sensitive adhesive so that the acrylic pressure-sensitive adhesive 6 may come to the surface side.

For example, in the case of the radiating material 2 made of radiating silicone gel and the radiating base material 1 made of urethane, first, the film having a peelable adhesive is coated with the acrylic pressure-sensitive adhesive 6, and a radiating silicone adhesive primer is applied thereon. On the other hand, the urethane is impregnated in the radiating silicone gel, and is passes through rolls. The urethane impregnating the radiating silicone gel and the acrylic pressure-sensitive adhesive 6 applied with a primer are fitted tightly so that the acrylic pressure-sensitive adhesive 6 may come to the surface side, and heated and cured to manufacture.

It is also possible to manufacture in another method comprising a step of coating a film having a peelable acrylic pressure-sensitive adhesive, and applying a primer for adhering with a radiating material to form a primer coated acrylic pressure-sensitive adhesive, a step of coating the primer coated acrylic pressure-sensitive adhesive with a radiating material to form an acrylic pressure-sensitive adhesive/uncured radiating material layer, a step of immersing a radiating material in a radiating base material, and passing through rolls to form an uncured spongiform radiating element, and a step of heating and curing by fitting tightly the uncured spongiform radiating element and the acrylic pressure-sensitive adhesive/uncured radiating material layer so that the acrylic pressure-sensitive adhesive 6 may come to the surface side.

Alternatively, after any one of the acrylic pressure-sensitive adhesive/uncured radiating material layer and the uncured spongiform radiating element is heated and cured, it may be similarly formed by fitting the both tightly so that the acrylic pressure-sensitive adhesive 6 may come to the surface side.

It may be also formed by forming the radiating silicone gel layer 4 on the spongiform radiating element 3 and then applying the acrylic pressure-sensitive adhesive 6 on the surface.

Although not shown, in order to release the foams entrapped in the joined interface through the foamed layer (spongiform radiating element 3), cuts may be made in the surface of the radiating sheet after applying the acrylic pressure-sensitive adhesive 6 on the radiating sheet, or after forming the radiating silicone gel layer 4 or aluminum foil layer 5 on the spongiform radiating element 3.

When forming cuts in the invention, the interval is preferred to be 20 mm or less, and more preferably 5 mm.

The spongiform radiating element 3 and the radiating sheet of the invention formed by forming or applying a single or plural layers of radiating silicone gel layer 4, aluminum foil layer 5, or acrylic pressure-sensitive adhesive 6 on the spongiform radiating element 3 are used not only in the PDP panel, but also in others requiring efficient releasing of heat such as power transistors and hi-density integrated circuit.

The radiating sheet of the invention can be tightly fitted to undulated surface flexibly, if the surface of the heat generating element or heat sink is not flat, and it is effective on complicated surfaces.

EXAMPLES

Examples of the invention are explained below. However, the invention is not limited to these examples alone.

Example 1

This is to show a manufacturing method and properties of a radiating sheet having silicone impregnated in urethane foam (silicon impregnated urethane foam).

(1) Urethane: Soft urethane foam 2 mm thick (Achilles)
(2) Mixing of silicone blend
SH1886 (Toray silicone)    100 parts
Alumina #500    300 parts These components were mixed and stirred by an agitator.

In the silicone blend prepared in (2), the urethane of (1) was immersed, and passed through nip rolls, and heated for 20 minutes at 120° C., and the silicone blend was cured. The roll interval of the nip rolls was 0.5 mm. At this time, the loading of the silicone blend on the urethane was 1.3 kg/m$^2$. In thus formed silicon impregnated urethane foam, the properties were as follows.

| Heat conductivity | |
| --- | --- |
| No compression | 0.48 W/m · k |
| 20% compression | 0.58 W/m · k |
| 40% compression | 0.91 W/m · k |
| Compressive stress | |
| 20% compression | 22 g/cm$^2$ |
| 40% compression | 40 g/cm$^2$ |

Example 2

This is to show a manufacturing method and properties of silicone impregnated urethane foam having silicone radiating sheets formed on both sides.

Both sides of the silicone impregnated urethane foam prepared in example 1 were coated with the silicone blend of (2) of example 1 in a thickness of 0.3 mm. The curing condition was 120° C. for 20 minutes. In this composition, the properties were as follows.

| Heat conductivity | |
| --- | --- |
| No compression | 0.75 W/m · k |
| 20% compression | 0.82 W/m · k |
| 40% compression | 1.1 W/m · k |
| Compressive stress | |
| 20% compression | 41 g/cm$^2$ |
| 40% compression | 180 g/cm$^2$ |

Example 3

This is to show a manufacturing method and properties of silicone impregnated urethane foam having an acrylic pressure-sensitive adhesive applied on both sides.

A peelable silicone film was coated with an acrylic adhesive, and a primer ME151 (GE Toshiba Silicone) for adhering the silicone was applied.

In the same manner as in example 1, radiating silicone was impregnated in urethane, and the primer coated acrylic adhesive was adhered to both sides, and heated for 20 minutes at 120° C. to cure the silicone and adhere to the acrylic adhesive.

In this method, a sheet having the acrylic pressure-sensitive adhesive on both sides was prepared.

The properties were as follows.

| Heat conductivity | |
| --- | --- |
| No compression | 0.51 W/m · k |
| 20% compression | 0.63 W/m · k |
| 40% compression | 0.98 W/m · k |
| Compressive stress | |
| 20% compression | 47 g/cm$^2$ |
| 40% compression | 202 g/cm$^2$ |
| Shearing adhesive strength: | 750 g/cm$^2$ (to glass) |

Example 4

This is to show a manufacturing method and properties of silicone impregnated urethane foam having an aluminum foil formed on one side.

On a 50-micron thick aluminum foil, a primer for adhering the silicone (ME151 of GE Toshiba Silicone) was applied.

The silicone blend of (2) of example 1 was further applied thereon in a thickness of 0.3 mm, and cured for 20 minutes at 120° C. and adhered to the aluminum foil.

Further, in the same manner as in example 1, radiating silicone was impregnated in urethane foam, and the silicone sheet applied to the aluminum foil was fitted tightly, and cured and adhered for 20 minutes at 120° C.

In this method, a sheet having the aluminum foil on one side was prepared.

The properties of this sheet were as follows.

| Heat conductivity | 3.4 W/m · k |
| --- | --- |
| Compressive stress | |
| 20% compression | 46 g/cm$^2$ |
| 40% compression | 231 g/cm$^2$ |

Example 5

The contact of the silicone impregnated urethane foam prepared in example 1 was tested and the following results were obtained.

An aluminum plate measuring 100 mm×50 mm×5 mm with a warp of about 1 mm was used, and the silicone impregnated urethane foam (2 mm thick) prepared in example 1 was applied on the entire surface, and a glass plate of the same size was put on, and a pressure of 35 g/cm$^2$ was applied, and the contact area between the glass and radiating sheet was 90% or more, and a favorable contact was confirmed.

By way of comparison, the same test was conducted by using a double-sided acrylic pressure-sensitive adhesive (manufacturer A: 1.6 mm thick), and the contact area was not greater than 5%.

In a further comparative example, the same test was conducted by using a silicone radiating sheet (TR-E of Mochida shoko, 1.6 mm thick), and the contact area was 30%.

According to the invention, the radiating sheet of excellent heat conductivity and strong adhesion was obtained.

Since the radiating sheet of the invention has pores, foams can be released. It is easy to deform, and lowering of adhesion is suppressed if slightly undulated, and the radiating sheet adhering the heat generating element and PDP glass panel tightly can be presented.

In the radiating sheet of the invention, if the precision of the aluminum panel is not very high, foams are not enclosed, and contact failure does not occur. Since foams are not enclosed, the heat can be released efficiently and uniformly from the heat generating element such as PDP glass panel.

By forming the silicone radiating sheet or aluminum foil on the surface of the radiating sheet, the heat can be released uniformly from the heat generating element or PDP glass panel.

Moreover, by presenting the radiating sheet or the acrylic pressure-sensitive adhesive on the radiating sheet having the silicone radiating sheet or aluminum foil formed on the surface, the contact of the radiating sheet and the PDP glass panel or aluminum panel is enhanced.

Further, when a film is adhered to the spongiform radiating element/radiating material layer, the smoothness is enhanced at the interface of the film and radiating material layer.

By forming cuts in the single radiating sheet or compound radiating sheet having the silicone radiating sheet, aluminum foil or acrylic pressure-sensitive adhesive formed or applied on the surface, foams are easily released from the radiating sheet.

Thus, the invention can provide a radiating sheet and its manufacturing method capable of presenting faulty contact due to improper precision of an aluminum panel, and releasing heat efficiently and uniformly from the heat generating element such as PDP glass panel. In addition, a radiating sheet tightly contacting with the heat generating element and glass panel and its manufacturing method are presented. According to the invention, a radiating sheet capable of releasing heat efficiently and uniformly, and the PDP panel using the radiating sheet can be easily manufactured.

What is claimed is:

1. A plasma display panel comprising a glass panel, an aluminum panel and a radiating sheet being inserted between the glass panel and the aluminum panel, wherein the radiating sheet comprises a spongiform radiating element which is made of a polyurethane foam impregnated with any one of the radiating materials selected from the group consisting of a silicone grease and an inorganically filled silicone gel.

2. A plasma display panel comprising a glass panel, an aluminum panel and a radiating sheet being inserted between the glass panel and the aluminum panel, wherein the radiating sheet comprises a spongiform radiating element being coated with a radiating material, wherein the spongiform radiating element is made of a polyurethane foam impregnated with any one of the radiating materials selected from the group consisting of a silicone grease and an inorganically filled silicone gel.

3. A plasma display panel comprising a glass panel, an aluminum panel and a radiating sheet being inserted between the glass panel and the aluminum panel, wherein the radiating sheet comprises a spongiform radiating element and an aluminum foil layer adhered to the spongiform radiating element, wherein the spongiform radiating element is made of a polyurethane foam impregnated with any one of the radiating materials selected from the group consisting of a silicone grease and an inorganically filled silicone gel.

4. A plasma display panel comprising a glass panel, an aluminum panel and a radiating sheet being inserted between the glass panel and the aluminum panel, wherein the radiating sheet comprises a spongiform radiating element and an acrylic pressure sensitive adhesive applied to a surface of the spongiform radiating element, wherein the spongiform radiating element is made of a polyurethane foam impregnated with any one of the radiating materials selected from the group consisting of a silicone grease and an inorganically filled silicone gel.

5. A plasma display panel comprising a glass panel, an aluminum panel and a radiating sheet being inserted between the glass panel and the aluminum panel, wherein the radiating sheet comprises a spongiform radiating element which is made of a polyurethane foam impregnated with any one of the radiating materials selected from the group consisting of a silicone grease and an inorganically filled silicone gel, wherein the radiating sheet is further formed with a cut in a surface thereof.

* * * * *